United States Patent
Griffiths et al.

(10) Patent No.: US 7,315,109 B1
(45) Date of Patent: Jan. 1, 2008

(54) ACTUATORS AND FLUID DELIVERY SYSTEMS USING SUCH ACTUATORS

(75) Inventors: David M. Griffiths, Pittsburgh, PA (US); Amy S. Pomaybo, Foxboro, MA (US); Alan D. Hirschman, Glenshaw, PA (US)

(73) Assignee: Medrad, Inc., Indianola, PA (US)

( * ) Notice: Subject to any disclaimer, the term of this patent is extended or adjusted under 35 U.S.C. 154(b) by 525 days.

(21) Appl. No.: 10/916,946

(22) Filed: Aug. 12, 2004

Related U.S. Application Data (60) Provisional application No. 60/495,386, filed on Aug. 15, 2003.

(51) Int. Cl.
*H01L 41/04* (2006.01)
*H01L 41/08* (2006.01)

(52) U.S. Cl. ....................... 310/800; 310/328

(58) Field of Classification Search ............... 310/311, 310/800, 328
See application file for complete search history.

(56) References Cited

U.S. PATENT DOCUMENTS

| | | | |
|---|---|---|---|
| 4,665,334 A | 5/1987 | Jamieson | |
| 4,731,069 A | 3/1988 | Krumme | |
| 4,954,812 A | 9/1990 | Lebron | |
| 5,101,848 A * | 4/1992 | Kojima et al. | 137/13 |
| 5,336,057 A | 8/1994 | Fukuda et al. | |
| 5,494,036 A | 2/1996 | Uber, III et al. | |
| 5,630,709 A | 5/1997 | Bar-Cohen | |
| 5,819,749 A * | 10/1998 | Lee et al. | 128/899 |
| 5,919,167 A | 7/1999 | Mulhauser et al. | |
| 6,154,000 A * | 11/2000 | Rastegar et al. | 318/632 |
| 6,536,476 B2 * | 3/2003 | Ueno et al. | 137/828 |
| 6,561,224 B1 * | 5/2003 | Cho | 137/831 |
| 6,679,279 B1 * | 1/2004 | Liu et al. | 137/13 |
| 2002/0008445 A1 * | 1/2002 | Pelrine et al. | 310/330 |
| 2003/0057391 A1 * | 3/2003 | Krulevitch et al. | 251/11 |

FOREIGN PATENT DOCUMENTS

| | | |
|---|---|---|
| DE | 19714711 | 10/1998 |
| JP | 7-178169 | 7/1995 |

OTHER PUBLICATIONS

Della Santa, A. et al., "Characterization and modeling of a conducting polymer muscle like linear actuator," Smart Mater. Struct, 6:23-24 (1997).
Shahinpoor, M. et al., "Ionic polymer-metal composites (IPMCs) as biomimetic sensors, actuators and artificial muscles—a review," Smart Mater. Struct., 7: R15-R30 (1998).

(Continued)

*Primary Examiner*—J. San Martin
(74) *Attorney, Agent, or Firm*—Gregory Bradley; Henry E. Bartony, Jr.

(57) ABSTRACT

An actuator includes a non-magnetic, electroactive material that is suitable to impart force upon application of an electric current, a power supply to provide an electric current to the electroactive material and a controller in operative connection with the power supply to control application of electric current to the electroactive material. In one embodiment, the controller is adapted to limit rates at which electric current is applied to or removed from the electroactive material to predefined rates, thereby reducing the potential for high frequency harmonic emissions.

34 Claims, 7 Drawing Sheets

OTHER PUBLICATIONS

Bar-Cohen, Y. et al., "Electro-Active Polymer (EAP) actuators for planetary applications," Proceedings of the SPIE Annual International Symposium on Smart Structures and Materials, Paper No. 3669-05 (1999).

Keeler, EK, et a., "Accessory Equipment Considerations with Respect to MRI Compatibility", JMRI 8: 12-18 (1998).

"Guidance for the Submission of Premarket Notifications for Magnetic Resonance Diagnostic Devices," U.S. Department of Health and Human Services, Food and Drug Administration, Center for Devices and Radiological Health (Nov. 14, 1998).

Lemieux, L., et al., "Recording of EEG During fMRI Experiments: Patient Safety," MRM, 38: 943-952 (1997).

Wax et al., "Electroactive Polymer Actuators and Devices," SPIE vol. 3669, pp. 2-9 (Mar. 1999).

U.S. Appl. No. 10/921,083, filed Aug. 18, 2004, Cowan et al.

* cited by examiner

Circuit Configuration for
Reducing RF Field Effects

FIG. 12

ACTUATORS AND FLUID DELIVERY SYSTEMS USING SUCH ACTUATORS

CROSS REFERENCE TO RELATED APPLICATION

This application claims the benefit of U.S. Provisional Application Ser. No. 60/495,386, filed on Aug. 15, 2003, the contents of which are incorporated herein by reference.

RELATED APPLICATION

This application contains subject matter that may be related to that disclosed or claimed in co-pending application Ser. No. 10/921,083, filed on Aug. 18, 2004, and entitled "Devices, Systems and Methods for Delivery of a Fluid into a Patient during a Magnetic Resonance Procedure."

BACKGROUND OF THE INVENTION

The present invention relates to actuators and fluid delivery systems, and especially, to nonmagnetic actuators and fluid delivery systems using such actuators suitable for use in the vicinity of a magnetic field of a magnetic resonance imaging system.

Magnetic resonance imaging (MRI) is used to image the body in a non-invasive manner. There are three types of electromagnetic fields used in MRI: a main static magnetic field (having field strengths from, for example, approximately 0.2 to several Tesla) which is generally homogeneous in the imaged volume; time varying magnetic gradient fields ($G_x$, $G_y$ and $G_z$), which have different orientations and operate at frequencies of the order of 1 kHz; and a radio frequency ("RF"; having, for example a frequency of approximately 63.87 MHz at 1.5 Tesla).

MRI is often used to image patients that may be attached to other types of equipment, such as ventilators, infusion pumps, or other devices. Some of these devices fail to operate correctly in the high magnetic fields generated in MRI and/or create undesirable artifacts in the resultant image. As a result, there are a substantial number of MRI procedures that are delayed or canceled because the patient cannot be connected to the needed equipment during the MRI procedure. A review of issues related to the compatibility of various equipment in an MRI environment is set forth in Keeler, E. K. et al., "Accessory Equipment Considerations with Respect to MRI Compatibility," *JMRI*, 8, 1 (1998), the disclosure of which is incorporated herein by reference. See also, Lemieux, L. et al., "Recording of EEG During fMRI Experiments: Patient Safety," *MRM*, 38, 943 (1997).

For example, devices that contain electric actuators such as DC brush motors, step motors, brushless DC motors or other wound coil motors and solenoids often fail in a strong magnetic field as a result of damage to internal permanent magnets. Moreover, currents induced within the field windings of such devices by electromagnetic fields can cause overheating and potential damage to the windings and any connected electronic circuitry.

Furthermore, differences in magnetic permeability of materials within the actuator and eddy currents induced within actuator windings can affect the homogeneity of the MRI magnetic field, generating image artifacts. Actuators that use mechanical commutation, such as DC brush motors, can also generate radio frequency energy during switching which can induce unwanted artifacts upon the acquired MRI images.

To prevent damage to sensitive equipment in MRI procedures, U.S. Pat. No. 4,954,812 discloses a magnetic field alarm indicator to detect when the ambient magnetic field reaches unacceptable levels for equipment operation. After an alarm indication, the equipment can be moved farther from the MRI magnet or disconnected from the patient. An alarm indication can be ineffective, however, if the equipment must be placed physically close to the patient, such as for fluid administration, or if the equipment must be closely connected to the patient. The use of a magnetic field alarm indicator also does not address the problems of unwanted effects on magnetic field homogeneity and commutation or switching artifacts.

A number of medical devices have been designed to operate within the relatively high magnetic field environment used for MRI. For example, U.S. Pat. No. 5,494,036, discloses an injector system that provides for decreased interference between the magnetic field used for producing diagnostic images and the magnetic fields generated by the electric motors used for driving the pistons of the contrast media injectors.

Japanese Patent Application HEI 7-178169 and German Patent Application DE 197 14 711 A1 disclose use of a piezoelectric-based actuators such as ultrasonic motors in an MRI environment in an effort to reduce the adverse effects experienced with other actuators. Piezoelectric-based motors provide a means for generating oscillating movement electrostatically rather than magnetically when a changing excitation voltage is applied. The oscillating movement is then converted into rotary or linear motion depending on the motor mechanism, for example, a rotary friction drive for a rotary motor. Piezoelectric actuators have a number of inherent disadvantages in that they are fragile, do not generate large amounts of force, do not operate at high speeds, and often require complex electronic circuitry to provide the driving signals for the piezoelectric element(s).

A number of non-magnetic actuators materials have also been used in environments other than an MRI environment. For example, U.S. Pat. No. 5,919,167 discloses a syringe based fluid delivery device based on a shape memory alloy (SMA) activating element. U.S. Pat. No. 4,731,069, discloses a tube for use in a flow controller that employs a shape memory alloy control element to adjust the rate of flow of the fluid. U.S. Pat. No. 4,665,334 discloses a mechanism for generating rotary motion using a shape memory alloy metal actuator.

U.S. Pat. No. 5,630,709 discloses the use of a piezoelectric stack and an electrostrictive material (magnetostrictive) as electroactive actuators to drive pistons and valves within an in-line pump with a transverse piston displacement arrangement. U.S. Pat. No. 5,336,057 discloses a pump that includes a liquid-absorptive polymer gel as part of an actuator for discharging liquid from a tank. The polymer gel operates by expanding when liquid is absorbed and is not electroactive.

It is very desirable to develop actuators and fluid delivery systems using such actuators for use in an MRI and other environments that reduce or eliminate the problems with current devices discussed above.

SUMMARY OF THE INVENTION

In several embodiments, the present invention provides nonmagnetic, electroactive actuators that are particularly suitable for use in a medical magnetic resonance imaging (MRI) environment. As used herein, the term "electroactive"

refers generally to any material that changes shape to apply a force upon application of electrical energy.

The actuators of the present invention are well adapted for use in a hospital setting within equipment that must be operated within the relatively high magnetic field environment used for MRI. For example, the actuators of the present invention can be used within patient fluid delivery systems including pumps, valves, regulators, and other fluid control devices. Likewise, the actuators of the present invention can be used in non-fluid delivery applications wherein an actuator is required, such as for automatic adjustment of an MR coil positioning system or other equipment. Moreover, the actuators of the present invention are also suitable for use in non-magnetic and/or non-medical environments.

In one aspect, the present invention provides an actuator including a non-magnetic, electroactive material that is suitable to impart force upon application of an electric current, a power supply to provide an electric current to the electroactive material and a controller in operative connection with the power supply to control application of electric current to the electroactive material. In one embodiment, the controller is adapted to limit rates at which electric current is applied to or removed from the electroactive material to predefined rates, thereby reducing the potential for high frequency harmonic emissions.

The electroactive material can, for example, be a shape memory alloy. Such a shape memory alloy can, for example, be an alloy of nickel and tin. The electroactive material can also, for example, be an electroactive ceramic material or an electroactive polymer. The current provided to the electroactive material can be pulsed.

In another aspect, the present invention provides a fluid delivery system including: a fluid chamber and at least one actuator adapted to pressurize fluid within the fluid chamber. The actuator includes a non-magnetic, electroactive material that is suitable to impart force upon application of an electric current, a power supply to provide an electric current to the electroactive material and a controller in operative connection with the power supply to control application of electric current to the electroactive material. In one embodiment, the controller is adapted to limit rates at which electric current is applied to or removed from the electroactive material to predefined rates, thereby reducing the potential for high frequency harmonic emissions.

The current provided to the electroactive material can be pulsed. In one embodiment, the electroactive material includes a shape memory alloy.

In one embodiment, the fluid chamber includes a collapsible enclosure having an inlet valve and an outlet valve therein. The electroactive material in this embodiment is adapted to change the volume of the collapsible enclosure. In another embodiment, the fluid chamber includes a syringe having a plunger disposed therein. The plunger is in operative connection with a piston member. The electroactive material is adapted to apply force to the piston member to pressurize the fluid within the syringe. The electroactive material can apply force in one direction to pressurize fluid within the syringe and in another direction to draw fluid into the syringe. The electroactive material can also apply force in one direction to pressurize fluid within the syringe, and a biasing element can be used to apply force and in another direction to draw fluid into the syringe.

In another embodiment, the fluid chamber is in fluid connection with a diaphragm, and the electroactive material is operable to compress the diaphragm.

In another embodiment, the fluid chamber includes a length of elastic tubing, and the actuator includes at least one pressure member that is operable to compress a section of the elastic tubing when a force is applied thereto by the electroactive material. Preferably, the actuator includes a plurality of pressure members, wherein each of the pressure members is operable to compress a section of the elastic tubing when a force is applied thereto by electroactive material in operative connection with the pressure member.

In a further aspect, the present invention provides a fluid delivery system including a syringe having a reciprocating plunger disposed therein. The plunger is in operative connection with a piston member. The piston member is in operative connection with an actuator including a nonmagnetic, electroactive spring adapted to apply force to the piston member to pressurize the fluid within the syringe. The electroactive material can, for example, be a shape memory alloy.

In another aspect, the present invention provides a fluid delivery system including a syringe having a reciprocating plunger disposed therein. The syringe includes an inlet and a outlet. The plunger is in operative connection with a piston member. The piston member is in operative connection with an actuator including a nonmagnetic, electroactive material adapted to apply force to the piston member to pressurize the fluid within the syringe. The electroactive material can apply force in one direction to pressurize fluid within the syringe and in another direction to draw fluid into the syringe. The electroactive material can also apply force in one direction to pressurize fluid within the syringe, and a biasing element can apply force in another direction to draw fluid into the syringe.

In another aspect, the present invention provides a fluid delivery system including a collapsible enclosure having an inlet valve and an outlet valve therein. The fluid delivery system further includes an actuator including a nonmagnetic, electroactive material that is adapted to change the volume of the collapsible enclosure.

In a further aspect, the present invention provides a fluid delivery system including a fluid chamber in fluid connection with a diaphragm. The fluid delivery system further includes an actuator having a nonmagnetic, electroactive material that is operable to compress the diaphragm.

In another aspect, the present invention provides a fluid delivery system including a length of elastic tubing and an actuator including at least one pressure member that is operable to compress a section of the elastic tubing when a force is applied thereto by a nonmagnetic, electroactive material. The actuator can include a plurality of pressure members, wherein each of the pressure members is operable to compress a section of the elastic tubing when a force is applied thereto by electroactive material in operative connection with the pressure member.

In still a further aspect, the present invention provides a method of applying a force to actuate an element in a magnetic resonance imaging environment, including the steps of: providing an electric current to a nonmagnetic, electroactive material and controlling the application of electric current to the electroactive material to limit the rate at which electric current is applied to or removed from the electroactive material, thereby reducing the potential high frequency harmonic emissions. The current can, for example, be applied to the electroactive material in a pulsed manner. At least a portion of circuit wiring can, for example, be twisted to reduce loop area, thereby reducing magnetic field effects. Moreover, circuitry designs can be incorporated as described below to reduce RF field effects.

DETAILED DESCRIPTION OF THE INVENTION

Materials for use in the actuators of the present invention are preferably of relatively small size, relatively light weight, relatively low-power consumption, and exhibit a relatively high strength-to-weight ratio. Moreover, such materials preferably enable precise control, AC or DC activation, long life, and direct linear action. The materials also preferably have low magnetic susceptibility and do not undergo large attraction forces or affect magnetic field homogeneity. Examples of suitable materials for use in the present invention include shape memory alloys (SMA), electroactive polymers (EAP) and Electroactive Ceramics (EAC).

Actuators designed with these materials can be constructed using geometries that can minimize the effects of induced electrical currents. Since these materials typically require only moderate amounts of current for actuation, they are more resistant to heating from induced currents than motors or solenoids. Because actuators of these materials can be designed without coils and do not rotate or move significantly within the magnetic field they are also more resistant to magnetically induced changes in efficiency and actuation force. Furthermore, the present invention provides control techniques that can be used with the actuators of the present invention to reduce potential interference effects, to reduce artifacts, to reduce controller susceptibility to induced currents and to maximize actuator life and reliability.

Figure 1:
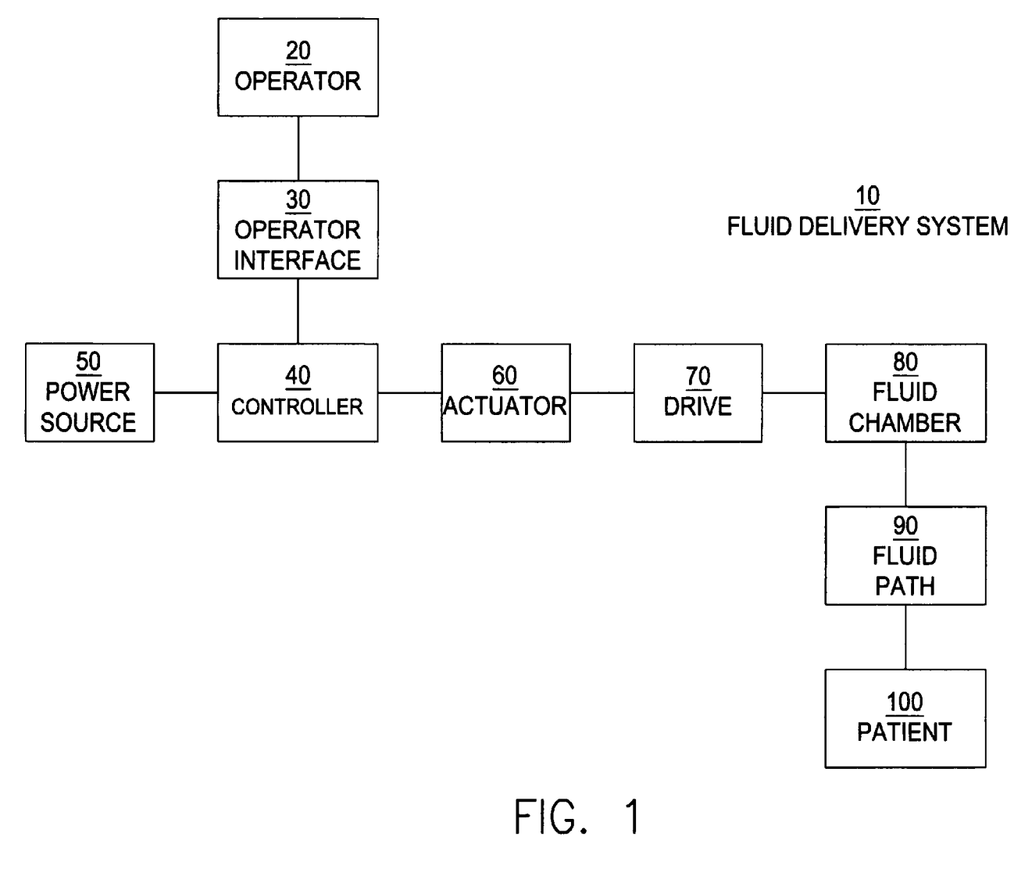
FIG. 1 illustrates schematically an embodiment of a fluid delivery system.

FIG. 1 shows the basic components of one embodiment of a fluid delivery system 10 that serves as a model environment for use of the actuators of the present invention. In this embodiment, fluid delivery system 10 preferably includes an operator interface 30 for input of data from an operator 20. Operator interface 30 is connected to a controller 40 that is supplied with power from a power source 50, (for example, a battery). Controller 40 sends activation energy to an actuator 60, which powers a drive mechanism 70. Drive mechanism 70 can, for example, be in operative connection with a fluid chamber 80 such as a syringe. Fluid chamber 80 connects to a patient 100 through a fluid path 90 such as sterile tubing.

Controller 40 preferably provides proper levels of power to the actuator material of actuator 60 so that the material does not overheat or "burn up". A current limiter 42 shown in FIG. 2 can provide this function. This function can, for example, be accomplished by either using a passive series resistance between power source 50 and actuator 60 or preferably by the use of an active regulator circuit that maintains a constant current to actuator 60. An active regulator current limiter may provide a linear or pulsed (for example, using pulse width modulation or PWM as known in the art) output to regulate the average power applied to the device. Power or current limiting is advantageous, for example, because it minimizes actuator heat dissipation and power consumption, which is useful for battery powered applications, while at the same time increasing actuator life and reliability by preventing overheating.

Figure 2:
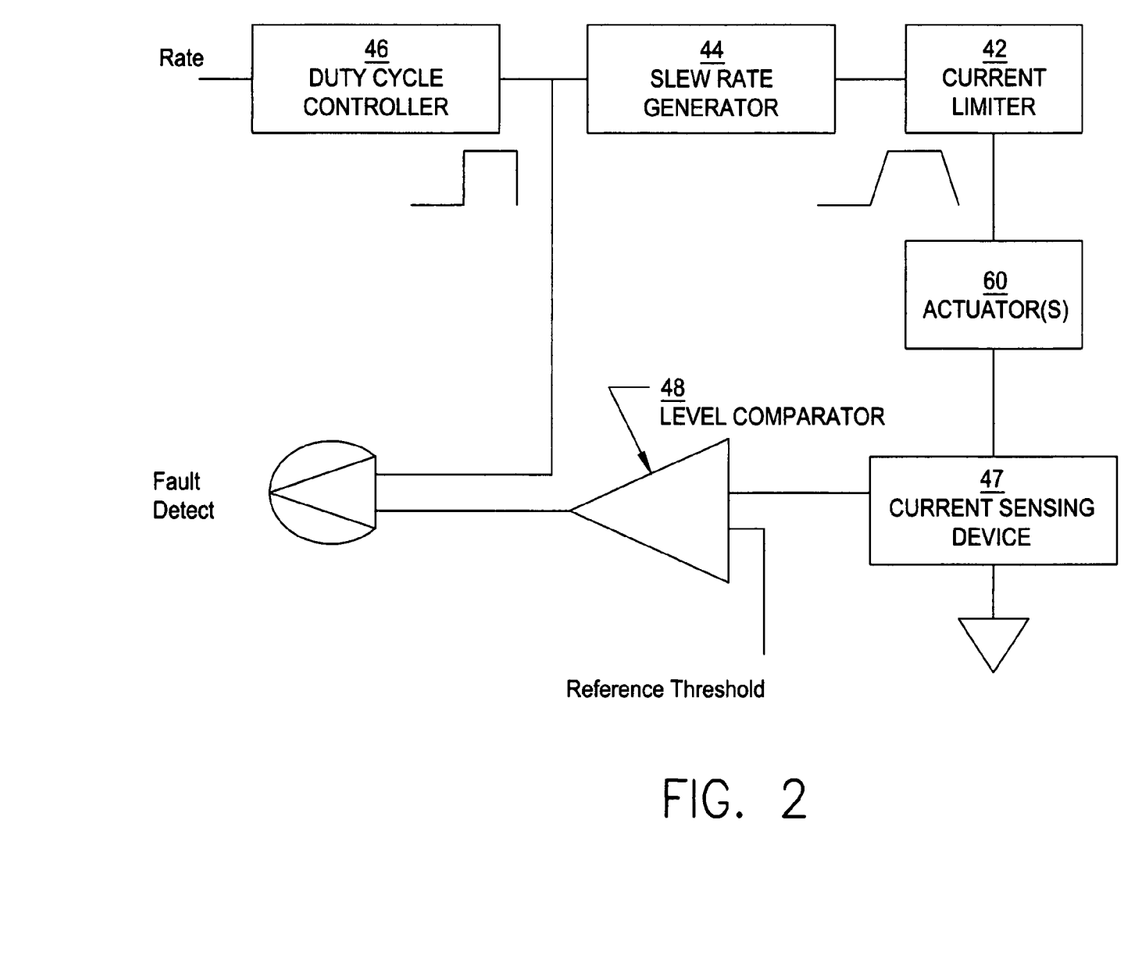
FIG. 2 illustrates schematically an embodiment of control and fault detection in the fluid delivery system of FIG. 1.

Controller 40 also preferably provides a constant current and a mechanism to slew the current at some maximum rate when it is applied as well as removed from actuator(s) 60. In one embodiment, a slew rate generator 44 (see FIG. 2) that controls the rate at which power is applied to and removed from current limiter 42 and thereby to actuator(s) 60. The effect on the shape of the power curve is illustrated in FIG. 2. The current is preferably slewed to reduce the high frequency content of any radiated electromagnetic emissions from actuator(s) 60 as power is applied thereto and removed therefrom (for example, using PWM). By applying and removing power in a gradual manner, the potential for high frequency harmonic emissions that can introduce MR imager artifacts is reduced. This approach also has the advantage of increasing actuator life by reducing thermal shock during activation and inactivation.

For various delivery schemes, it is preferable that controller 40 be able to operate in a pulsed manner as described above to apply power to actuator(s) 60. In a pulsed mode, power is applied and removed from actuator(s) 40 to generate a repeated motion needed to operate, for example, a pump. The pulse rate or duty cycle of controller 40 directly affects the delivery rate of the pump. A duty cycle controller 46 can perform this function (see FIG. 2). Given a rate input command, duty cycle controller 46 generates the appropriate duty cycle to operate the pump and deliver the correct flow rate output. The duty cycle function can, for example, be performed by a micro-controller or various other control mechanisms as known in the art.

It is also preferable that controller 40 include a fault detection mechanism to detect if actuator current is below some limit, indicating actuator failure. This detection can, for example, be performed using a current sensing device or sensor 47, such as a resistor, and a level comparator circuit 48. When actuator 60 is on, and the sensed current is below some threshold level when the duty cycle controller 46 is active, a fault is detected. This feature is especially useful when multiple actuators are grouped and operated mechanically and electrically in parallel to generate greater levels of force. If, for example, one of a plurality of actuators 40 fails, the total current draw will be below some predetermined limit, indicating a failure. It is also possible to monitor for over current conditions as well as other fault conditions as known in the art.

Shape Memory Alloys

A technology that is particularly suitable for operation in the MRI environment is based on shape memory alloy (SMA) materials. Shape memory alloys are materials that quickly snap from a cold-formed shape to a stiff, hot-formed shape when a critical temperature is passed. One type of shape memory alloy material includes a class referred to as Nitinol. Nitinol is a nickel-titanium (NiTi) shape memory alloy that can assume different forms or "phases" at distinct temperatures. Nitinol is commonly formed into objects called "muscle wires". These muscle wires are typically thin, highly processed strands of Nitinol material that contract with force when heated. In general, a small force easily stretches these wires at room temperature. However, when conducting an electric current, the wire heats and changes to a much harder form that returns to an "un-stretched" shape, shortening in length with a usable amount of force. Typically, SMA muscle wires can be stretched by up to eight percent of their length and will recover fully, but only for a few cycles. However when used in the three to five percent range of stretch, SMA muscle wires can run for millions of cycles with very consistent and reliable performance. Large wires are stronger than small ones, and strength varies with diameter. SMA materials such as Nitinol also come in many forms other than wire that are also suitable for use in the present invention, including: ribbon, tube, sheet, stranded wire, braided wire, sputtered targets and thin films.

SMA materials exhibit many of the desirable characteristics discussed above. For example, compared to motors or solenoids, SMA muscle wire actuators and other SMA based actuators have many advantages including, but not limited to: small size, light weight, low power, a very high strength-to-weight ratio, precise control, AC or DC activation, long life, and direct linear action. In particular, these alloys have low magnetic susceptibility and do not undergo large attraction forces or affect magnetic field homogeneity. Furthermore, SMA actuators require only moderate amounts of current to heat the material for actuation and can be designed without coils.

Electroactive Polymer Actuated Systems

Other electroactive actuator technologies suitable for use in the present invention include several types of electroactive polymer (EAP) materials. This group of materials includes: conducting polymers (CP), polyelectrolyte gels, electrostrictive polymers, piezoelectric polymers, and ionic polymer-metal composites. See, for example, Della Santa, A. et al., "Characterization and modeling of a conducting polymer muscle like linear actuator," *Smart Mater. Struct.*, 6 23-24 (1997); Shahinpoor, M. et al., "Ionic polymer-metal composites (IPMCs) as biomimetic sensors, actuators and artificial muscles—a review," *Smart Mater. Struct.*, 7 No 6 R15-R30 (December 1998). Most of these types of materials have been explored in research of artificial muscles and muscle like actuators. In general, electrically active polymers offer greater displacement capabilities than electroactive ceramics (EACs), are lower in weight than SMA or EAC materials, have a greater response speed than SMA material and have better fatigue characteristics than SMA materials. See Bar-Cohen, Y. et al., "Electro-Active Polymer (EAP) actuators for planetary applications," *Proceedings of the SPIE Annual International Symposium on Smart Structures and Materials*, Paper No. 3669-05 (March 1999).

Piezoelectric polymer actuators, typically made from polyvinylideneflouride (PVDF), require high driving voltages (~300 V) and produce relatively small strains (<1%). Piezoelectric polymer actuators are fast and highly reliable and suitable for small displacement, low power applications.

Conductive polymers undergo dimensional changes when electrically activated based on electrochemical doping and de-doping processes. Examples of conductive polymer materials include, but are not limited to, polyanilines, polypyrroles, and polythiophenes. Conductive polymer actuators can have relatively large dimensional changes (for example, in the range of approximately 0.5 to 10%) and generate high stresses (for example, a few to several thousand psi). Stimulation voltage is relatively low (typically, on the order of just a few volts).

Polyelectrolyte gels use direct chemical conversion to produce large contractions. Polymeric gels are biphasic systems composed of a solid phase or elastic matrix permeated by a fluid, generally water. Electrocoupling mechanisms are needed with these actuators to allow activation by an electrical drive. Gel actuators generate large strains (for example, 50% or more) and lower forces than conducting polymers. Response time of polyelectrolyte gels is slow, however, as compared to other materials.

Ion-exchange polymer metal composites (IPMCs) are electroactive actuators that show large deformation in the presence of low applied voltage (on the order of several volts) and exhibit low impedance. Strips of these composites can create large bending and flapping displacement when an electric field is applied.

Polymer actuators can, for example, be formed as individual units, as stacked assemblies for greater displacement, or in the shape of flexible beams that can be flapped or bent. Each of these structures may be used with an appropriate mechanism to control fluid delivery, valve operation or other motion.

Table 1 provides exemplary data for comparison of typical properties of shape memory alloy, ionic polymer metal composite and electroactive ceramic actuator materials. FIG. 3 through FIG. 10 illustrates several embodiments of fluid delivery systems incorporating electroactive actuators of the present invention. The embodiments of FIGS. 3 through 10 are illustrated and described to include SMA wires, but are readily adapted to use an electroactive polymer material or an electroactive ceramic material as the actuator element. Moreover, the actuators of the present invention are suitable for use in any system requiring an actuator and are not limited to use in fluid delivery systems.

TABLE 1

| Property | Ionic polymer-metal composites (IMPC) | Shape memory alloys (SMA) | Electroactive ceramics |
| --- | --- | --- | --- |
| Actuation Displacement | >10% | <8% short fatigue life | 0.1-0.3% |
| Force (MPa) | 10-30 | about 700 | 30-40 |
| Reaction speed | s to s | s to min | s to s |
| Density | 1-2.5 g cm$^{-3}$ | 5-6 g cm$^{-3}$ | 6-8 g cm$^{-3}$ |
| Drive voltage | 4-7 V | NA | 50-800 V |
| Power consumption | Watts | watts | Watts |
| Fracture toughness | resilient, elastic | elastic | elastic |

Syringe Pistons

Figures 3, 4, 5:
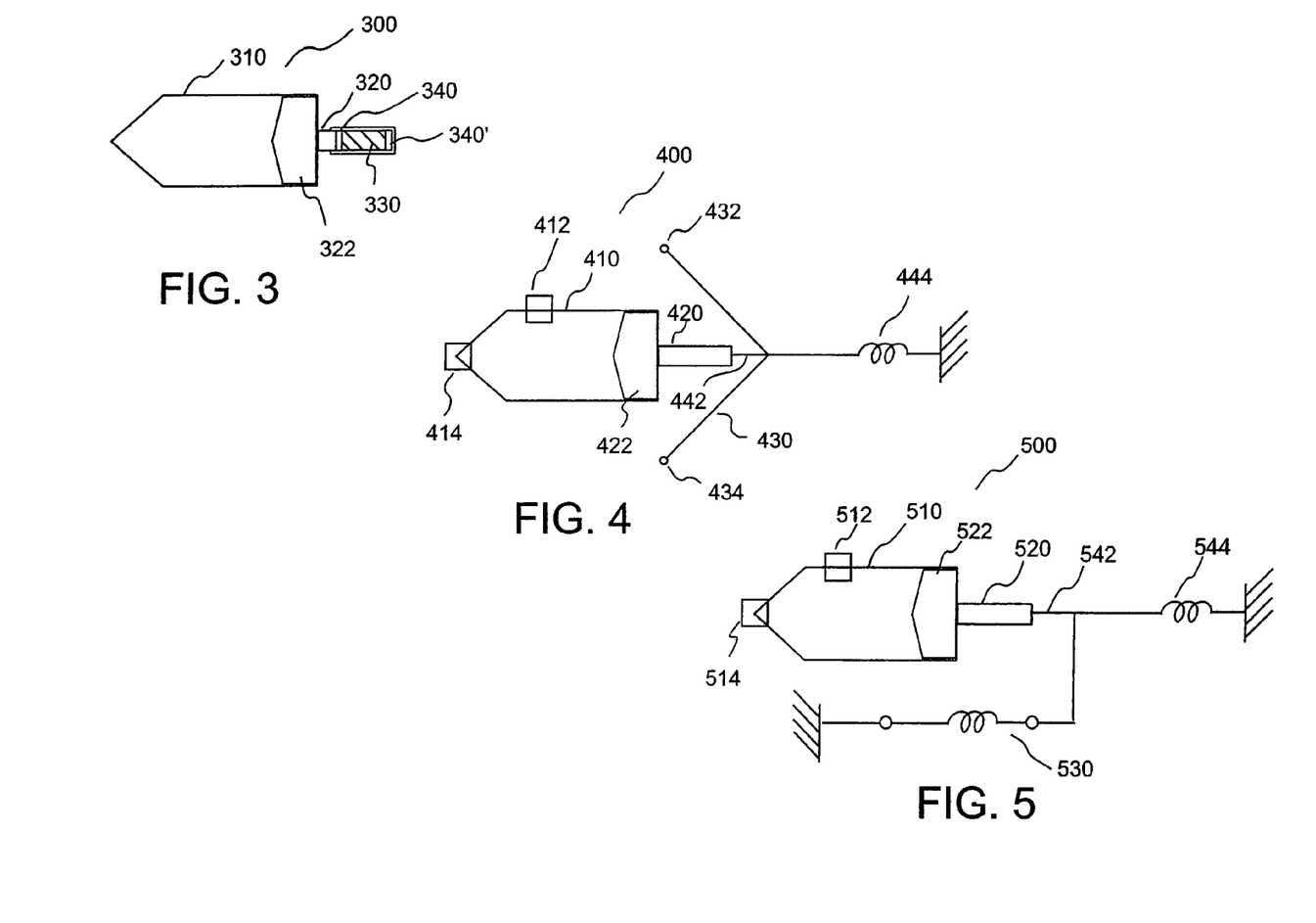
FIG. 3 illustrates an embodiment of a syringe system including an electroactive spring.
FIG. 4 illustrates an embodiment of a syringe system including an electroactive actuator wire and a bias spring.
FIG. 5 illustrates another embodiment of a syringe system including an electroactive actuator wire and a bias spring.

Syringe system 300 preferably includes a syringe 310, a piston rod 320, a plunger 322 and an actuating spring 330 (for example, an SMA actuating spring) as illustrated in FIG. 3. Piston rod 320 is preferably attached to electroactive spring 330 via two retainers 340 and 340' (one of which is fixed and the other one moving). As, for example, an SMA spring 330 contracts when heated, piston rod 320 retracts a given distance, or stroke upon such heating, permitting fluid to fill syringe 310. Upon cooling, SMA spring 330 returns to its original position, thereby injecting fluid from syringe 310.

Other embodiments of syringe systems are illustrated in FIGS. 4 and 5. In the embodiment of FIG. 4, syringe system 400 preferably includes a syringe 410 including an inlet valve 412 and an outlet valve 414. Syringe system 400 also includes a piston rod 420. Piston rod 420 is in operative connection with a plunger 422 and with an electroactive actuator such as an SMA wire 430 that is attached to piston rod 420 via wire 442 and fixed at two external contact points 432 and 434 in, for example, a triangular arrangement (which allows a relatively large displacement). As SMA wire 430 is heated, piston rod 420 retracts a given distance, or stroke. During retraction, a bias spring 444 in connection with wire 442 provides a force that varies linearly with the piston rod position. When SMA wire 430 cools, bias spring 444 returns piston rod 420 to its original position.

In the embodiment of FIG. 5, syringe system 500 preferably includes a syringe 510 including an inlet valve 512 and an outlet valve 514. Syringe system 500 also includes a piston rod 520 as described above. Piston rod 520 is in operative connection with a plunger 522 and with an electroactive actuator such as an SMA spring wire 530 that is attached to piston rod 520 via wire 542. Wire 542 is also in operative connection with a bias spring 544 which operates generally as described above for bias spring 444.

Peristaltic Pumps

Figures 6, 7, 8:
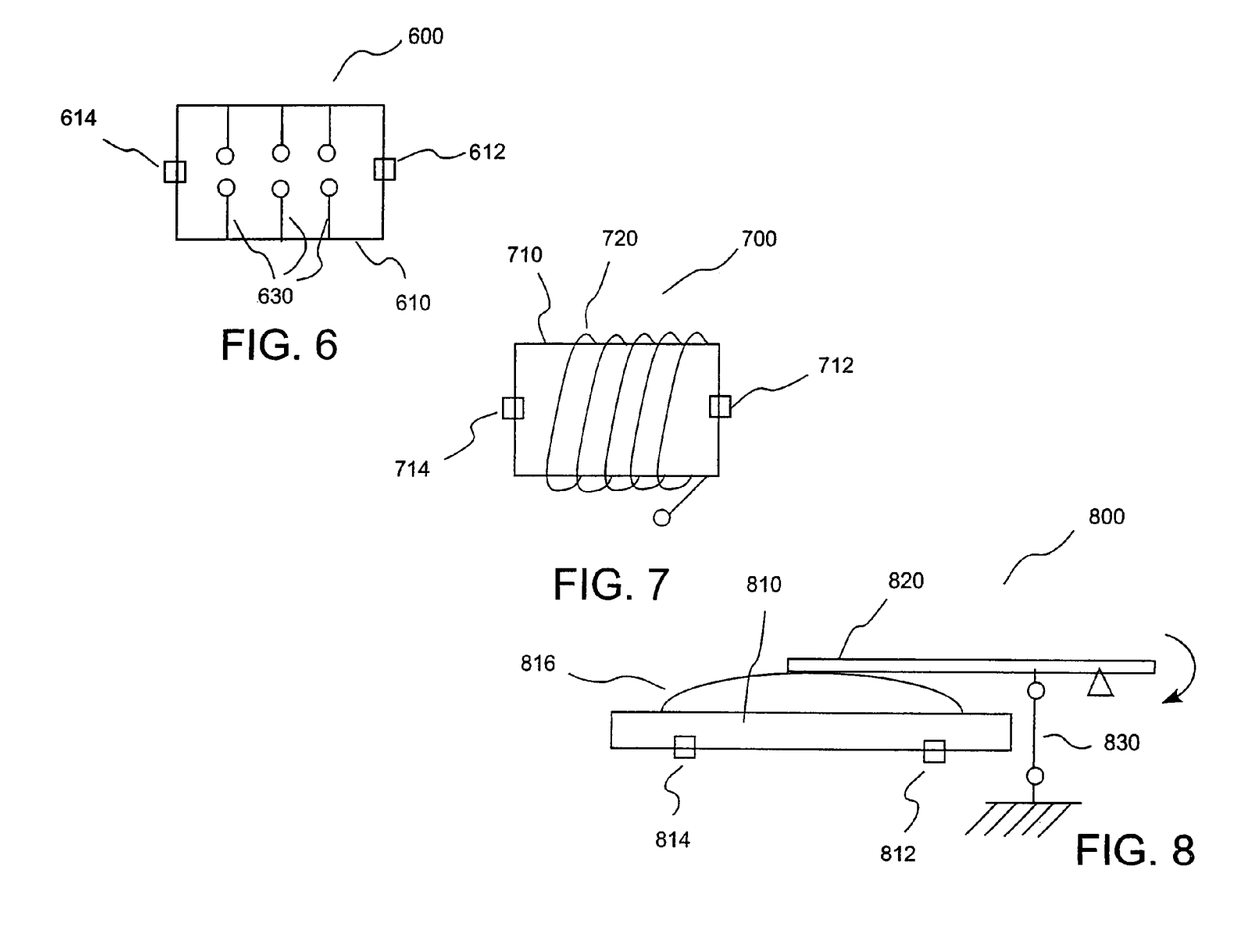
FIG. 6 illustrates an embodiment of a flexible pump chamber including electroactive actuator rings.
FIG. 7 illustrates an embodiment of a flexible pump chamber including an electroactive actuator coil.
FIG. 8 illustrates an embodiment of a diaphragm activated by a pivoting lever arm in operative connection with an electroactive actuator.

FIG. 6 illustrates an embodiment of a peristaltic pump system 600 that preferably includes a flexible or collapsible pump chamber 610. Collapsible pump chamber includes an inlet valve 612 and an outlet valve 614, which may be passive check valves that open and close with changes in pressure in collapsible chamber 610. Collapsible pump chamber 610 is preferably at least partially encompassed by one or more electroactive actuators 630 such as SMA wires that restrict and relax to change the volume of collapsible pump chamber 610. Cyclic activation of SMA wires 630, for example, causes the flexible or collapsible pump chamber 610 to compress and expand, pumping fluid. Passive check valves 612 and 614 preferably open and close with changes in chamber pressure to alternatively draw fluid into collapsible pump chamber 610 and inject fluid from collapsible pump chamber 610. Valves 612 and 614 can also be activated by electroactive actuators of the type described herein.

FIG. 7 illustrates an alternative embodiment of a peristaltic pump system 700 in which a collapsible or flexible pump chamber 710 is contracted and expanded via a coiled electroactive actuator 720 (for example, a coiled SMA wire) encompassing at least a portion thereof. Inlet valve 712 and outlet valve 714 preferably operate as described above.

Collapsible pump chambers 610 and 710 can be made of a resilient material that expands upon extension of electroactive actuators 630 and 730, respectively. Alternatively, electroactive actuators 630 and 730 can be attached to the exterior of collapsible pump chambers 610 and 710, respectively, to force expansion of collapsible pump chambers 610 and 710.

Diaphragms

FIG. 8 illustrates an embodiment of a pump system 800 including a fluid chamber 810 including an inlet valve 812 and an outlet valve 814. Fluid chamber 810 is in fluid connection with or partially defined by a diaphragm 816. Pump system 800 preferably further includes an actuating member such a pivoting lever arm 820 operable to compress diaphragm 816. Actuating member or lever arm 820 is actuated by an electroactive actuator such as an SMA wire 830. When powered, SMA wire 830 shortens and causes lever arm 820 to pivot. Pivoting of lever arm 820, in turn, compresses diaphragm 816 and pumps fluid out of outlet valve 814. Lengthening SMA wire 830 allows diaphragm 816 to force lever arm 820 to its original position and draws fluid within chamber 810 via inlet valve 812.

Linear Peristaltic Pumps

Figures 9, 10:
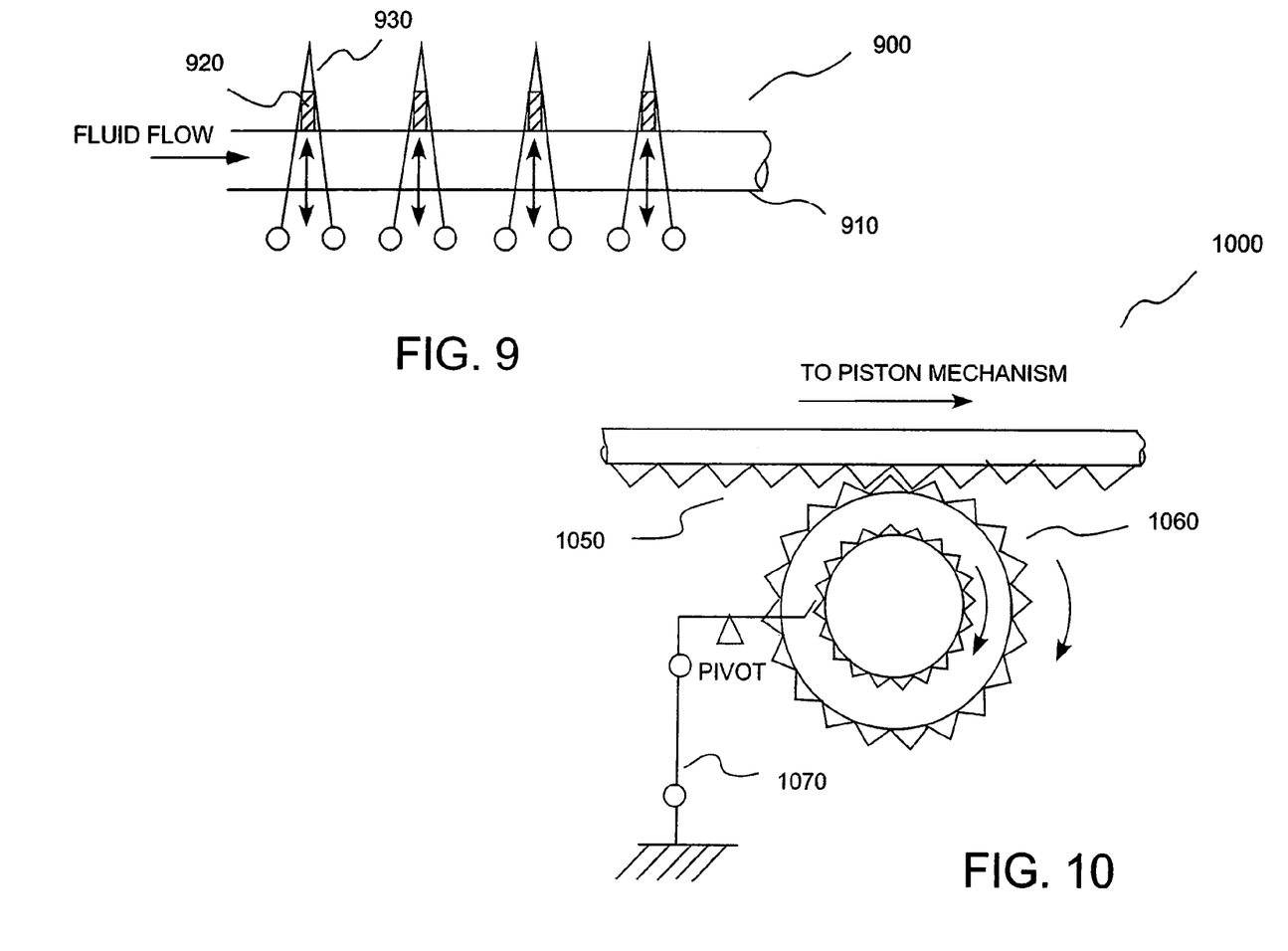
FIG. 9 illustrates an embodiment of a linear peristaltic pump including electroactively actuated pins.
FIG. 10 illustrates an embodiment of electroactively actuated rotor mechanism.

An embodiment of a linear peristaltic pump system 900 is illustrated in FIG. 9. Linear peristaltic pump system 900 preferably includes a length of elastic tubing 910. One or more actuating member 920 are positioned adjacent elastic tubing 910. Each actuating member 920 is in operative connection with an electroactive actuator 930 suitable to force actuating member 920 in a direction to compress a section of elastic tubing 910 adjacent actuating member 920. In one embodiment, actuating member(s) 930 are each in operative connection with lengths of SMA wire that are attached to actuating members 920 along the length of the tubing and fixed at two external contact points in a triangular arrangement as illustrated in FIG. 9. When powered, the SMA wire(s) shorten and causes actuating members 920 to change position, impinging upon tubing 910 (preferably in a timed or cyclic manner as known in the peristaltic pump art), thereby pumping fluid.

Rotors

FIG. 10 illustrates a rotor actuating mechanism 1000 preferably including a rack and tooth gear drive 1050 and a rotor for ratchet drive 1060. A electroactive actuator such as an SMA wire 1070 is preferably in operative connection with ratchet drive 1060. As SMA wire 1070 contracts, rotor and drive gear 1060 turn and move rack mechanism 1050 which is coupled to a piston mechanism (not shown) to, for example, pump fluid.

There are several design strategies that can be used to optimize the use of these types of actuators for the MR environment.

Reducing Static Field Effects

The static field in the MR environment can range from 0.06 T to 4.0 T. Keeler, E K, et al, Accessory Equipment Considerations with Respect to MRI Compatibility, JMRI, Vol. 8, No. 1. The current flowing through the actuator when enabled will generate a force when in the field. This force is proportional to the area of the circuit loop. For example, a typical SMA actuator may require 200 mA when enabled. Assuming a assuming a worst-case perpendicular orientation of the magnetic field to the loop, the calculated force when enabled would be 0.1 N.

Figure 11:
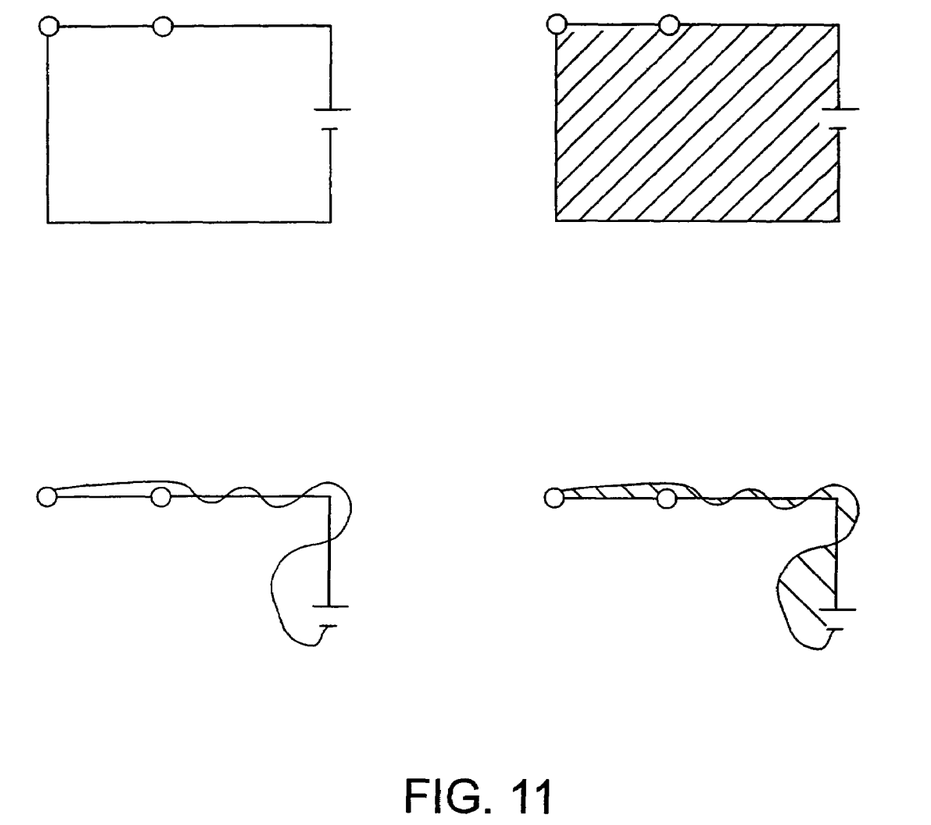
FIG. 11 illustrates a schematic representation of reduction of loop area to reduce force effects from a magnetic field.

Twisting the circuit wires together around each other as possible so as to minimize the collective loop area can also reduce force effects from the static field (see FIG. 11).

In addition, currents can be induced within actuator circuit, if the circuit loop is moved with some velocity within the static field. Many devices containing actuators are stationary relative to the static field during use, so induced currents from velocity effects do not occur. If the device must be moved through the static field when enabled, minimizing the loop area will reduce induced current effects.

Reducing Gradient Field Effects

In addition to a large static field, there are rapidly changing magnetic fields ("gradients") that are used during imaging. Maximum gradients are on the order of 20 T/sec, per FDA guidelines. "Guidance for the Submission of Premarket Notifications for Magnetic Resonance Diagnostic Devices," U.S. Department Of Health and Human Services Food and Drug Administration Center for Devices and Radiological Health (Nov. 14, 1998). Since the induced voltage from a changing magnetic field within a circuit loop is proportional to the area of the loop, by constructing actuators using small circuit loops, effects from induced currents can be minimized.

For example, given a change in magnetic field flux or gradient of 20 T/sec and a loop area of 10 cm$^2$, assuming a worst case perpendicular coupling of the magnetic field to the loop, the calculated induced voltage (E=−A dB/dT) would be on the order of—0.02 V.

Induced voltage effects can also be reduced by twisting the circuit wires together around each other.

Reducing RF Field Effects

Figure 12:
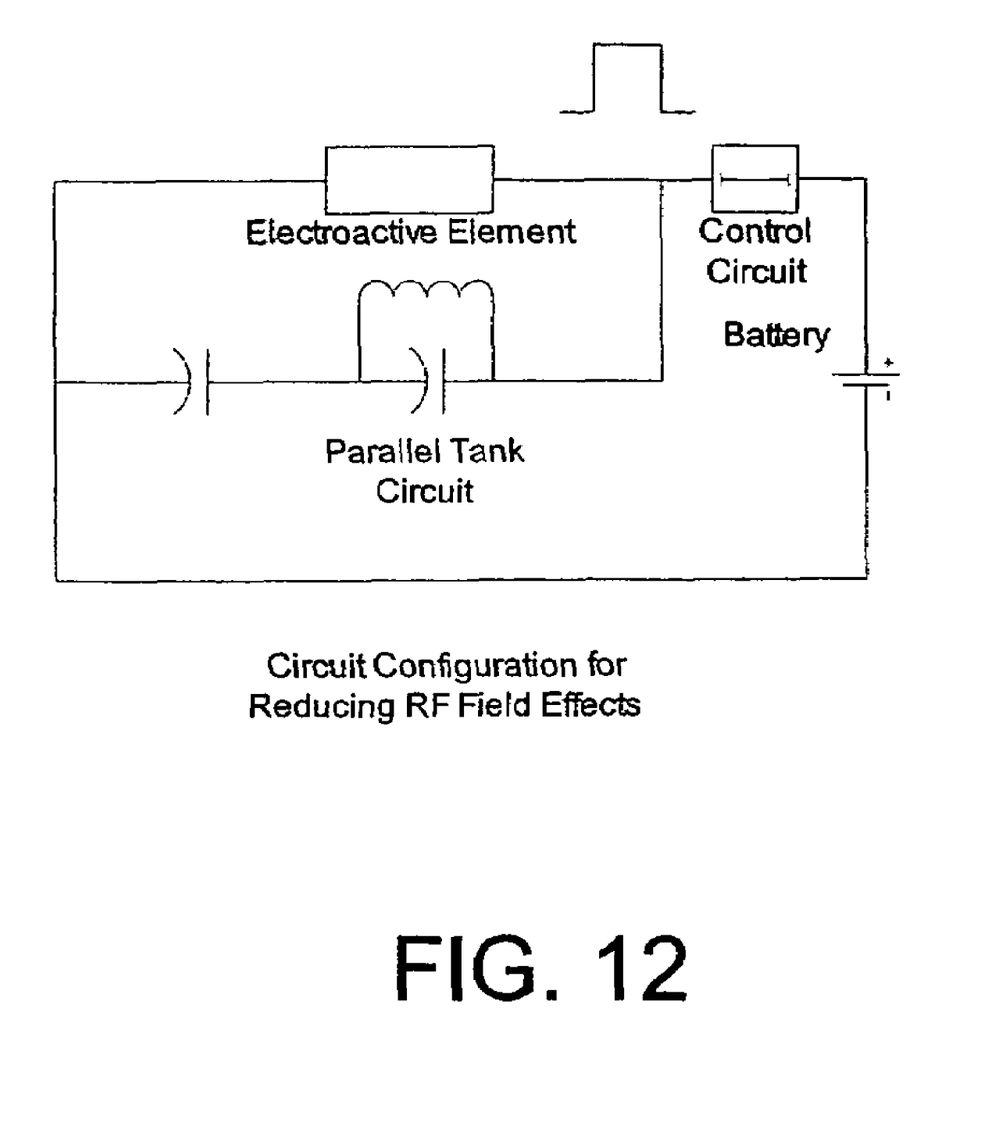
FIG. 12 illustrates an embodiment of circuitry to reduce RF field effects.

Equipment within the imaging environment can be affected by the RF transmit field. The amount of RF energy that can be coupled can be controlled by appropriate design measures. One approach is to place a faraday shield or RF tight enclosure around the circuit. Another approach is to tune the circuit electrical length using additional impedance so that the coupling is low near the Larmor frequency of the MR system (eg. 21.3 MHz for a 0.5 T magnet, or 64 MHz for a 1.5 T magnet). Other approaches include electrically decoupling the circuit using passive decoupling, through the use of a parallel tank circuit that shunts the induced RF voltage during the transmit period. The tank circuit is placed across the actuator (see FIG. 12 for a representative embodiment). Circuit components should be designed so that they are able to handle the induced currents.

Although the present invention has been described in detail in connection with the above examples, it is to be understood that such detail is solely for that purpose and that variations can be made by those skilled in the art without departing from the spirit of the invention. The scope of the invention is indicated by the following claims rather than by the foregoing description. All changes to the present invention that fall within the meaning and range of equivalency of the claims are to be embraced within their scope.

What is claimed is:

1. An actuator comprising:
   a non-magnetic, electroactive material that is suitable to impart force upon application of an electric current;
   a power supply to provide an electric current to the electroactive material; and
   a controller in operative connection with the power supply to control application of electric current to the electroactive material, the controller comprising:
      a current limiter to limit rates at which electric current is applied to or removed from the electroactive material to predefined rates; and
      a slew rate generator in operative connection with the current limiter to control the rate at which power is applied to or removed from the current limiter, thereby reducing the potential for high frequency harmonic emissions.

2. The actuator of claim 1 wherein the electroactive material is a shape memory alloy.

3. The actuator of claim 2 wherein the shape memory alloy is an alloy of nickel and tin.

4. The actuator of claim 1 wherein the electroactive material is an electroactive ceramic material.

5. The actuator of claim 1 wherein the electroactive material is an electroactive polymer.

6. The actuator of claim 1 wherein the current provided to the electroactive material is pulsed.

7. The actuator of claim 1 wherein the current limiter comprises a passive series resistance.

8. The actuator of claim 1 wherein the current limiter comprises an active regulator circuit.

9. The actuator of claim 8 wherein the active regulator circuit provides a linear or pulsed current to the electroactive material.

10. The actuator of claim 1 wherein the controller comprises a duty cycle controller.

11. The actuator of claim 1, further comprising a fault detection mechanism to detect when the current output of the electroactive material is below a predetermined limit.

12. The actuator of claim 11 wherein the fault detection mechanism comprises a current sensor and a level comparator circuit.

13. The actuator of claim 12 wherein the current sensor comprises a resistor.

14. A fluid delivery system comprising:
   a fluid chamber and at least one actuator adapted to pressurize fluid within the fluid chamber, the actuator including a non-magnetic, electroactive material that is suitable to impart force upon application of an electric current;
   a power supply to provide an electric current to the electroactive material; and
   a controller in operative connection with the power supply to control application of electric current to the electroactive material, the controller comprising:
      a current limiter to limit rates at which electric current is applied to or removed from the electroactive material to predefined rates; and
      a slew rate generator in operative connection with the current limiter to control the rate at which power is applied to or removed from the current limiter, thereby reducing the potential for high frequency harmonic emissions.

15. The fluid delivery system of claim 14 wherein the current provided to the electroactive material is pulsed.

16. The fluid delivery system of claim 15 wherein the electroactive material includes a shape memory alloy.

17. The fluid delivery system of claim 15 wherein the fluid chamber includes a collapsible enclosure having an inlet valve and an outlet valve therein, the electroactive material being adapted to change the volume of the collapsible enclosure.

18. The fluid delivery system of claim 15 wherein the fluid chamber includes a syringe having a plunger disposed therein, the plunger being in operative connection with a piston member, the electroactive material being adapted to apply force to the piston member to pressurize the fluid within the syringe.

19. The fluid delivery system of claim 18 wherein the electroactive material is adapted to apply force in one direction to pressurize fluid within the syringe and in another direction to draw fluid into the syringe.

20. The fluid delivery system of claim 18 wherein the electroactive material is adapted to apply force in one direction to pressurize fluid within the syringe and a biasing element is used to apply force in another direction to draw fluid into the syringe.

21. The fluid delivery system of claim 15 wherein the fluid chamber is in fluid connection with a diaphragm, the electroactive material being operable to compress the diaphragm.

22. The fluid delivery system of claim 15 wherein the fluid chamber includes a length of elastic tubing, the actuator including at least one pressure member that is operable to compress a section of the elastic tubing when a force is applied thereto by the electroactive material.

23. The fluid delivery system of claim 22 wherein the actuator includes a plurality of pressure members, each of the pressure members being operable to compress a section of the elastic tubing when a force is applied thereto by electroactive material in operative connection with the pressure member.

24. The fluid delivery system of claim 14 wherein the current limiter comprises a passive series resistance.

25. The fluid delivery system of claim 14 wherein the current limiter comprises an active regulator circuit.

26. The fluid delivery system of claim 25 wherein the active regulator circuit provides a linear or pulsed current to the electroactive material.

27. The fluid delivery system of claim 14 wherein the controller comprises a duty cycle controller.

28. The fluid delivery system of claim 14, further comprising a fault detection mechanism to detect when the current output of the electroactive material is below a predetermined limit.

29. The fluid delivery system of claim 28 wherein the fault detection mechanism comprises a current sensor and a level comparator circuit.

30. The fluid delivery system of claim 29 wherein the current sensor comprises a resistor.

31. A method of applying a force to actuate an element in a magnetic resonance imaging environment, comprising:

providing an electric current to a nonmagnetic, electroactive material;

controlling the application of electric current to the electroactive material to limit the rate at which electric current is applied to or removed from the electroactive material; and slewing the electric current as it is applied to and removed from the electroactive material, thereby reducing the potential high frequency harmonic emissions.

32. The method of claim 31 wherein the current is applied to the electroactive material in a pulsed manner.

33. The method of claim 31 wherein at least a portion of circuit wiring is twisted to reduce loop area.

34. The method of claim 31, further comprising:

detecting when the current output of the electroactive material is below a predetermined limit.

* * * * *